US010811425B2

(12) United States Patent
Yano et al.

(10) Patent No.: US 10,811,425 B2
(45) Date of Patent: Oct. 20, 2020

(54) NOR FLASH MEMORY AND MANUFACTURING METHOD THEREOF

(71) Applicant: Winbond Electronics Corp., Taichung (TW)

(72) Inventors: Masaru Yano, Kanagawa (JP); Riichiro Shirota, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/892,350

(22) Filed: Feb. 8, 2018

(65) Prior Publication Data

US 2018/0247944 A1    Aug. 30, 2018

(30) Foreign Application Priority Data

Feb. 28, 2017  (JP) ................. 2017-037089

(51) Int. Cl.
*H01L 27/1157*   (2017.01)
*H01L 27/11582*  (2017.01)
(Continued)

(52) U.S. Cl.
CPC .... *H01L 27/1157* (2013.01); *H01L 27/11573* (2013.01); *H01L 29/7926* (2013.01); *H01L 27/11582* (2013.01); *H01L 29/40117* (2019.08)

(58) Field of Classification Search
CPC ............ H01L 27/1157; H01L 29/7926; H01L 21/28282; H01L 29/66666; H01L 27/2454;
(Continued)

(56) References Cited

U.S. PATENT DOCUMENTS 9,230,985 B1   1/2016  Wu et al.
9,472,286 B2  10/2016  Chen
(Continued)

FOREIGN PATENT DOCUMENTS

CN   103038882   4/2013
CN   105990361  10/2016
(Continued)

OTHER PUBLICATIONS

Office Action of Taiwan Counterpart Application, dated Sep. 26, 2018, pp. 1-4.
(Continued)

*Primary Examiner* — John A Bodnar
(74) *Attorney, Agent, or Firm* — JCIPRNET

(57) ABSTRACT

An NOR flash memory comprising a memory cell of a 3D structure and a manufacturing method thereof are provided. The flash memory 100 includes a plurality of columnar portions 120, a plurality of charge accumulating portions 130 and a plurality of control gates 140. The columnar portions 120 extend from a surface of a silicon substrate 110 in a vertical direction and include an active region. The charge accumulating portions 130 are formed by way of surrounding a side portion of each columnar portion 120. The control gates 140 are formed by way of surrounding a side portion of each charge accumulating portion 130. One end portion of the columnar portion 120 is electrically connected to a bit line 150 via a contact hole, and another end portion of the columnar portion 120 is electrically connected to a conductive region formed on a surface of the silicon substrate 110.

5 Claims, 10 Drawing Sheets

(51) Int. Cl.
*H01L 27/11573* (2017.01)
*H01L 29/792* (2006.01)
*H01L 21/28* (2006.01)

(58) Field of Classification Search
CPC ....... H01L 29/78642; H01L 21/823885; H01L 29/7828; H01L 29/7827
See application file for complete search history.

(56) References Cited

U.S. PATENT DOCUMENTS

| | | | |
|---|---|---|---|
| 9,691,786 B1* | 6/2017 | Tsuji | H01L 27/11582 |
| 9,711,530 B1* | 7/2017 | Ikawa | H01L 27/11582 |
| 2005/0035399 A1* | 2/2005 | Masuoka | H01L 21/26586 257/329 |
| 2005/0121716 A1* | 6/2005 | Hill | H01L 27/115 257/324 |

FOREIGN PATENT DOCUMENTS

| | | |
|---|---|---|
| JP | H11110987 | 4/1999 |
| JP | 2003100092 | 4/2003 |
| JP | 2009283740 | 12/2009 |
| JP | 2011124240 | 6/2011 |
| JP | 2015149503 | 8/2015 |
| JP | 2016058494 | 4/2016 |

OTHER PUBLICATIONS

"Office Action of Korea Counterpart Application," dated Feb. 28, 2019, p. 1-p. 10.

\* cited by examiner

NOR FLASH MEMORY AND MANUFACTURING METHOD THEREOF

CROSS-REFERENCE TO RELATED APPLICATION

This application claims the priority benefit of Japan application serial no. 2017-037089, filed on Feb. 28, 2017. The entirety of the above-mentioned patent application is hereby incorporated by reference herein and made a part of this specification.

BACKGROUND OF THE INVENTION

Field of the Invention

The invention relates to a NOR flash memory, and particularly relates to a structure of a memory cell.

Description of Related Art

Flash memories generally include NAND flash memories and NOR flash memories. In the NAND flash memory, by constructing a memory cell array including a NAND string, an occupation area thereof is decreased to implement a highly-integrated memory cell array. On the other hand, the NOR flash memory is a structure configuring a memory cell between a bit line and a source line, although a high-speed random access may be performed to one memory cell, it is required to contact each of the memory cells, and compared to the NAND flash memory, an occupation area of the memory cells of the NOR flash memory is large.

In order to improve an integration degree, the NOR flash memory adopts a virtual grounding mode or a multi-value mode. In the typical virtual grounding mode, a source/drain of the memory cell is commonly used as a source/drain of a memory cell located adjacent to the above memory cell along a row direction, and the commonly used source and drain are electrically connected to the bit line. In a reading operation, a ground level is applied to the source of the selected memory cell, and a reading voltage is applied to the drain, and the source/drain of the adjacent memory cell is in a floating state (patent literature 1, 2).

In the multi-value mode, by controlling charges of a charge accumulating region facing a floating gate or trapping charges, a plurality of thresholds is set to the memory cells. A patent literature 3 discloses a mirror bit type flash memory to serve as a charge trapping type multi-value memory. In the flash memory, an ONO film of oxide film-nitride film-oxide film is formed between a surface of a silicon substrate and a gate electrode to trap the charges to a boundary of the oxide film and the nitride film. By changing a voltage applied to the source/drain, the charges are respectively kept on a source side and a drain side of the nitride film (a charge accumulating layer) to store data of 2 bits to a memory cell. Moreover, a following structure is provided, i.e. a separated ONO film is formed near two ends of the gate electrode to separate the charge accumulating region in a physical manner.

Moreover, along with high integration of semiconductor devices, three-dimensional (3D) NAND flash memories stacking the memory cells in three-dimension or along a vertical direction have been developed (for example, a patent literature 4). On a semiconductor substrate of the flash memory, a plurality of pillars extending from a surface of the semiconductor substrate along the vertical direction is formed, and a memory film containing a tunnelling insulation layer, a charge accumulating layer and a barrier insulation layer surrounds a sidewall of each of the pillars.

EXISTING TECHNICAL LITERATURES

Patent Literatures

[Patent literature 1] Japan Patent Publication No. 2003-100092

[Patent literature 2] Japan Patent Publication No. H 11-110987

[Patent literature 3] Japan Patent Publication No. 2009-283740

[Patent literature 4] Japan Patent Publication No. 2016-58494

Problems to be Resolved

The NOR flash memory also has reduced memory cells under requirements of high operation current and high integration degree, though a scaling ratio thereof is reaching a limit. If a channel length of the memory cell is shortened, a distance between the source and the drain is also shortened, alternatively, if a design rule is reduced, the distance between the gate electrode and the source/drain is also shortened, and the memory cell may be randomly conducted due to accidental breakdown, which is a reason of read error or write error, etc. Moreover, even in case of such situation, an operation time of a programming or deleting operation is also required to be reduced.

SUMMARY OF THE INVENTION

The invention is directed to resolve the aforementioned problems, and provide an NOR flash memory comprising a memory cell of a three-dimensional structure and a manufacturing method thereof.

Technical Means for Resolving the Problems

The invention provides a NOR flash memory including a substrate; a conductive region, formed on the substrate; a plurality of columnar portions, extending from a surface of the substrate in a vertical direction and including an active region; a plurality of charge accumulating portions, formed by way of surrounding a side portion of each of the columnar portions; and a plurality of control gates, formed by way of surrounding a side portion of each of the charge accumulating portions. One end portion of the columnar portion is electrically connected to a bit line via a contact hole, and another end portion of the columnar portion is electrically connected to the conductive region.

Preferably, the columnar portion includes silicon or polysilicon, where a drain region is formed at one end portion of the columnar portion, and a source region is formed at another end portion of the columnar portion. Preferably, the columnar portion substantially has a cylindrical shape, and the charge accumulating portion surrounds a side portion of the cylindrical shape by a circle. Preferably, the charge accumulating portion includes an oxide film (O), a nitride film (N) and an oxide film (O). Preferably, the conductive region is an $n^+$ silicon layer formed on a silicon substrate. Preferably, the conductive region is a metal layer formed on the silicon substrate and an $n^+$ polysilicon layer on the metal layer. Preferably, the metal layer is a high melting point silicide layer. Preferably, the conductive region constructs a source line, and is commonly connected to the columnar portions. Preferably, the substrate is a silicon substrate, a peripheral circuit of a memory cell is formed on the silicon substrate, and the memory cell is formed on the conductive region formed on the silicon substrate.

The invention provides a method for manufacturing a NOR flash memory, which includes following steps: forming a conductive region on a substrate; forming a buffer layer on the conductive region; forming an opening reaching the conductive region in the buffer layer; forming a silicon layer or a polysilicon layer in a region containing the opening; removing a part of the silicon layer or the polysilicon layer, and forming a columnar portion containing silicon or polysilicon on the substrate; forming a charge accumulating portion in way of surrounding a side portion of the columnar portion; forming a control gate by way of surrounding a side portion of the charge accumulating portion; forming an inter-layer insulation film on the substrate including the columnar portion and the control gate; and forming a contact hole in the inter-layer insulation film, and forming a bit line electrically connected to one end portion of the columnar portion.

Preferably, the method further includes a step of planarizing the silicon layer or the polysilicon layer until the buffer layer is exposed. Preferably, the step of forming the buffer layer includes forming a first buffer layer, and forming a second buffer layer on the first buffer layer. The method further includes a step of selectively removing the second buffer layer after the silicon layer or the polysilicon layer is planarized. Preferably, the method further includes a step of diffusing a dopant of the conductive region to the end portion of the columnar portion. Preferably, the method further includes a step of forming an insulation layer on the substrate, and forming a metal layer on the insulation layer, where the conductive region is formed on the metal layer. Preferably, the metal layer is a high melting point silicide metal.

Effects of the Invention

In the invention, by constructing the memory cell in three-dimension, an active region of the memory cell is formed without being limited by a two-dimension scale. In this way, high integration and high operation current of the memory cell are simultaneously implemented.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. An NOR flash memory of a three-dimensional (3D) structure is introduced. Moreover, figures are drawn in order to easily describe the invention, and it should be noted that a scale of each component shown in the figures is not necessarily complied with a scale of an actual device.

EMBODIMENTS

Figure 1A:
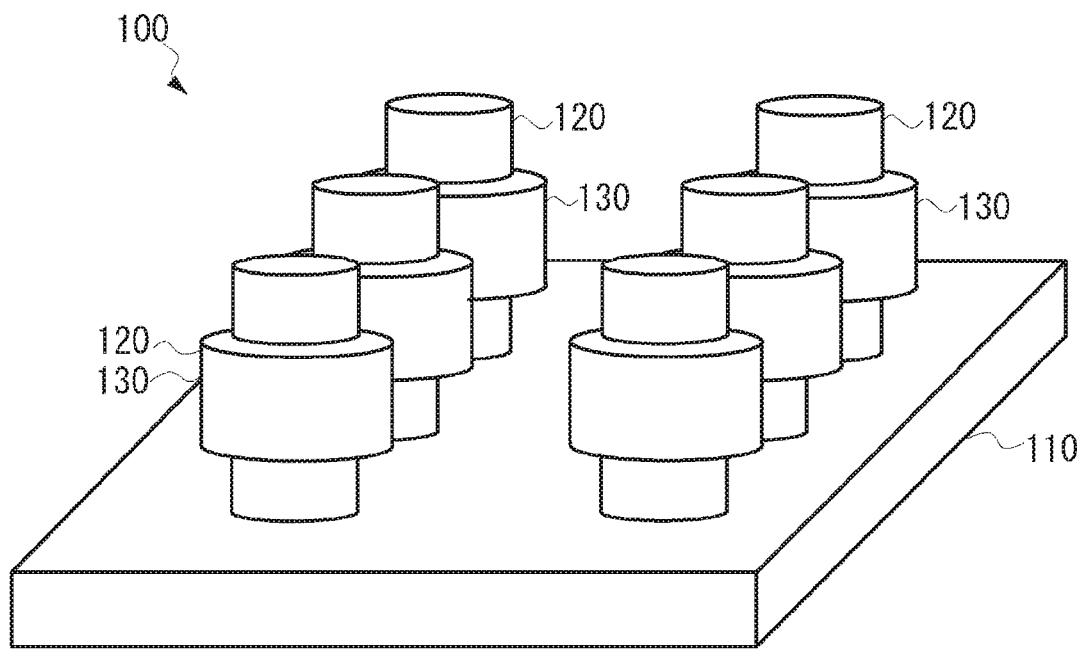
FIG. 1(A) is a three-dimensional view of a schematic structure of a NOR flash memory according to an embodiment of the invention.
Figure 1B:
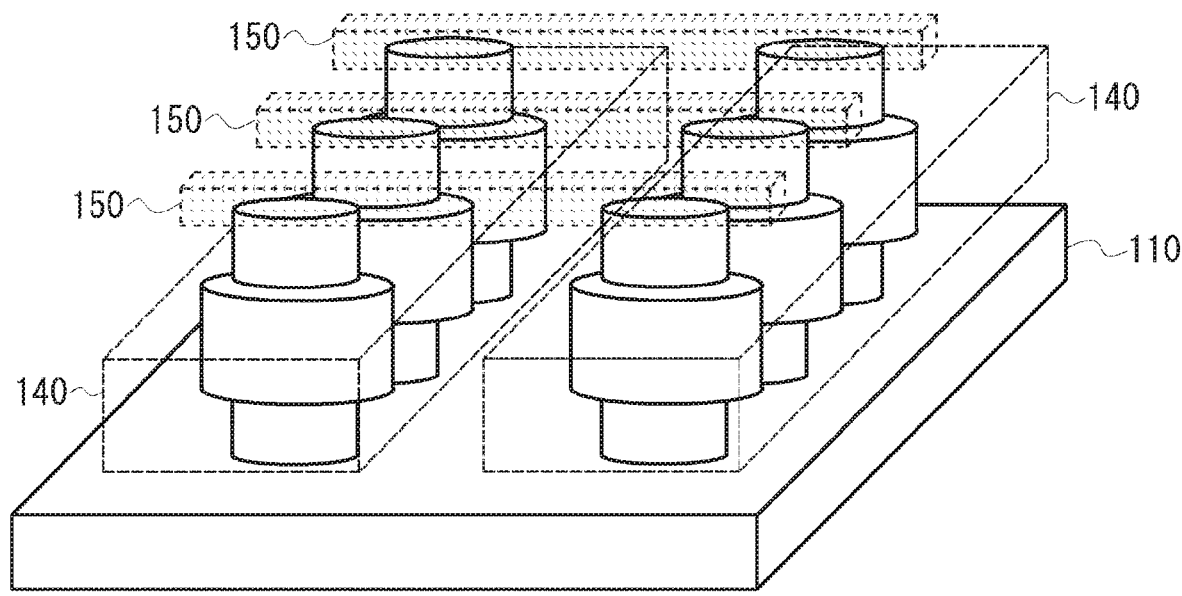
FIG. 1(B) is a three-dimensional view of schematic structures of bit lines and control gates.

FIG. 1(A) is a schematic three-dimensional view of columnar portions of memory units of the NOR flash memory according to an embodiment of the invention, and FIG. 1(B) is a schematic three-dimensional view of bit lines and control gates connected to the columnar portions.

As shown in FIG. 1(A), the NOR flash memory 100 of the present embodiment includes a semiconductor substrate 110, a plurality of columnar portions 120 extending from a surface of the semiconductor substrate 110 in a vertical direction; and a plurality of charge accumulating portions 130 formed by way of surrounding a side portion of each of the columnar portions 120. The semiconductor substrate 110 is, for example, a silicon substrate. The columnar portion 120, for example, includes cylindrical silicon or polysilicon, and forms an active region or a channel region of a memory cell. In case that the memory cell has an n-type metal oxide semiconductor (MOS) structure, the columnar portion 120, for example, includes p-type silicon or polysilicon.

Figure 2A:
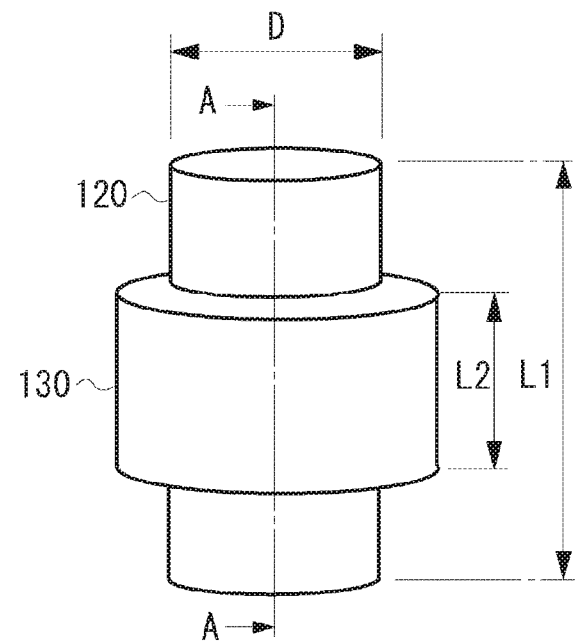
FIG. 2(A) is a three-dimensional view of a columnar portion of a memory cell according to an embodiment of the invention.
Figure 2B:
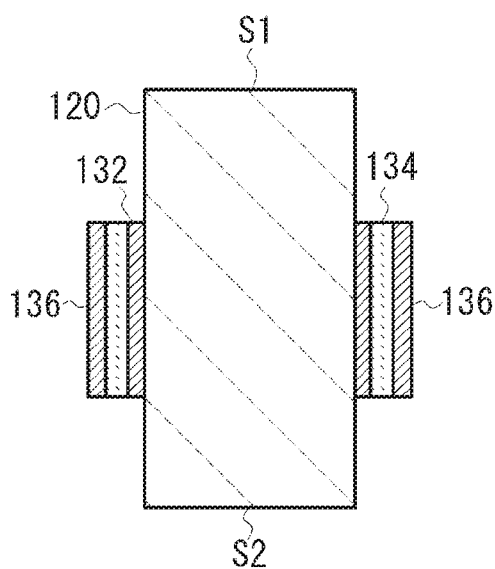
FIG. 2(B) is a cross-sectional view of FIG. 2(A) along a section line A-A.

FIG. 2(A) is a three-dimensional view of the columnar portion 120, and FIG. 2(B) is a cross-sectional view of FIG. 2(A) along a section line A-A. The columnar portion 120 has a cylindrical shape with a diameter D and a length L1 along a vertical direction. However, this is an example, the columnar portion 120 may also be prism-like. As described below, the diameter D of the columnar portion 120 is determined by a size of an opening formed in the buffer layer, and the length L1 is determined by a thickness of the buffer layer. A drain region is formed at an end portion of the columnar portion 120, and a source region is formed at another end portion of the columnar portion 120. When the memory cell has an n-type MOS structure, the drain region and the source region are respectively n-type.

The charge accumulating portion 130 completely surrounds a roughly central side portion of the columnar portion 120 in a belt shape. The charge accumulating portion 130 includes a layer or a boundary used for accumulating charges. Ideally, the charge accumulating portion 130 includes a substance with a higher dielectric constant, so as to provide a high capacitance coupling between the control gate 140 and the columnar portion 120. For example, counting from the inside, the charge accumulating portion 130 sequentially includes an oxide film (O) 132, a nitride film (N) 134 and an oxide film (O) 136, and the charges are trapped to the boundary of the ONO film. A length of the charge accumulating portion 130 in the vertical direction is L2 (L2<L1), and the length L2 is substantially equivalent to a channel length.

As shown in FIG. 1(B), the control gates 140 are formed by way of surrounding the charge accumulating portions 130 of the columnar portions 120. One end portion S1 of the columnar portion 120 is the drain region, and each drain region of the columnar portions 120 in a row direction is commonly and electrically connected to a bit line 150, and another end portion S2 of the columnar portion 120 is the source region, and each source region of the columnar portions 120 is commonly and electrically connected to a source line SL. The control gate 140 is electrically connected to a word line that is now shown, and when an operation voltage is applied to the word line, an electric field is applied to the columnar portion 120 through the charge accumulating portions 130. When a reading operation is performed, if electrons are not accumulated to the charge accumulating portions 130, a larger electric field is applied to the columnar portion 120 compared to the situation that electrons are accumulated to the charge accumulating portions 130, so as to form an inversion layer at the columnar portion 120, and a current flows between the source/drain. If electrons are accumulated to the charge accumulating portions 130, the inversion layer is not formed, and the current does not flow between the source/drain. In the present embodiment, the columnar portion 120 substantially has the cylindrical shape, and the belt-like charge accumulating portion 130 surrounds the columnar portion 120. In this way, the electric field uniformly functions on the periphery of the columnar portion 120 from the control gate 140, so as to form a ring-like inversion layer at the periphery of the columnar portion 120.

Figure 3:
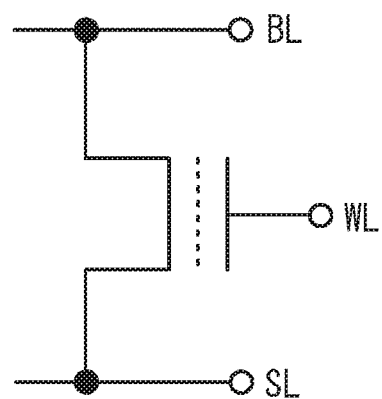
FIG. 3 is an equivalent circuit diagram of a NOR memory cell.

FIG. 3 is an equivalent circuit diagram of a memory cell. When a reading operation is performed to the memory cell, a reading voltage is applied to a word line WL, a certain positive voltage is applied to a bit line BL, and a ground voltage GND is applied to the source line SL. When charges are accumulated to the charge accumulating portion 130, a threshold of the memory cell is increased, and the memory cell operates in a turn-off manner, and when charges are accumulated to the charge accumulating portion 130, the threshold of the memory cell is decreased, and the memory cell operates in a turn-on manner.

When data is programmed to the memory cell, a high voltage is applied to the word line WL, the positive voltage is applied to the bit line BL, the ground voltage GND is applied to the source line SL, and the memory cell is turned on. In this way, the current flows to the source from the drain, and hot electrons produced in the channel are trapped by the charge accumulating portion (ONO) 130.

There are two methods for deleting data held by the memory cell. One method is to release the charges trapped by the charge accumulating portion 130 to the substrate through Fowler-Nordheim (FN) tunnelling. For example, a negative voltage is applied to the word line WL of the memory cell, and a positive voltage is applied to the channel region side to make the source and the drain to be in a floating state, and the electrons may pass through the charge accumulating portion 130 for releasing to the channel region. Another method is to inject hot holes to the charge accumulating portion 130 to couple the hot holes and the trapped charges. In this case, the negative voltage is applied to the word line of the memory unit and the positive voltage is applied to the drain region to make the source region to be in the floating state, and the hot holes are injected to the charge accumulating portion 130.

Figure 4A:
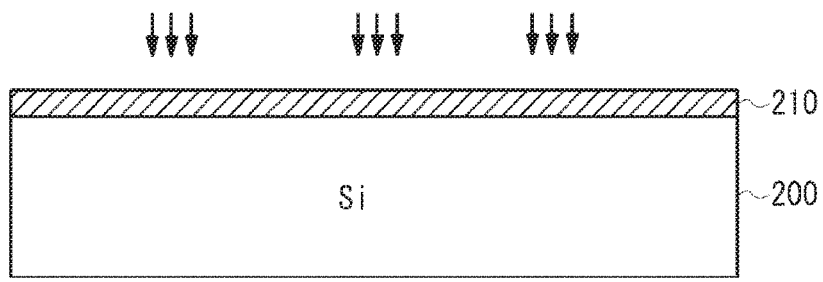
FIG. 4(A) to FIG. 4(D) are schematic cross-sectional views of manufacturing steps of the NOR flash memory according to a first embodiment of the invention.

Then, referring to FIG. 4(A) to FIG. 7 for a manufacturing method of memory cells according to a first embodiment of the invention. For simplicity's sake, formation of one memory cell is shown in the figures. As shown in FIG. 4(A), a silicon substrate 200 is prepared. The silicon substrate 200 is a semi-insulating i-type or p-type substrate. Dopant ions such as phosphorus or arsenic ions are implanted into a surface of the silicon substrate 200 to form an $n^+$ high dopant layer 210 on the surface of the silicon substrate 200. An ion implantation energy and time are properly selected based on a dopant concentration or film thickness of the high dopant layer 210. The high dopant layer 210 constructs the source line SL of the memory cell array.

Figure 4B:
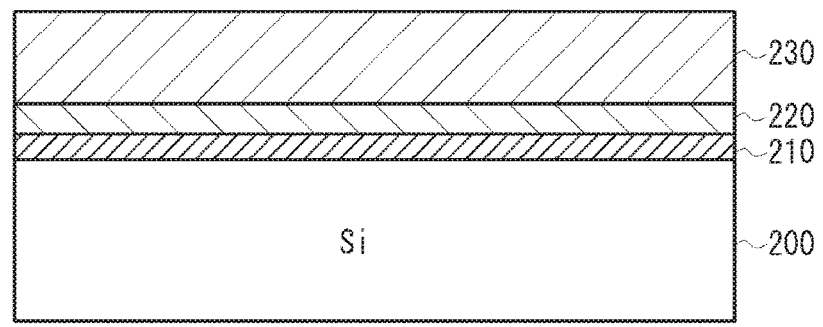

Then, as shown in FIG. 4(B), a first buffer layer 220 is formed on a whole surface of the high dopant layer 210. The first buffer layer 220 is, for example, a silicon oxide film ($SiO_2$). Then, a second buffer layer 230 is formed on a whole surface of the first buffer layer 220. The second buffer layer 230 is, for example, a silicon nitride film (SiN). The first buffer layer 220 and the second buffer layer 230 are, for example, deposited through chemical vapour deposition (CVD).

Figure 4C:
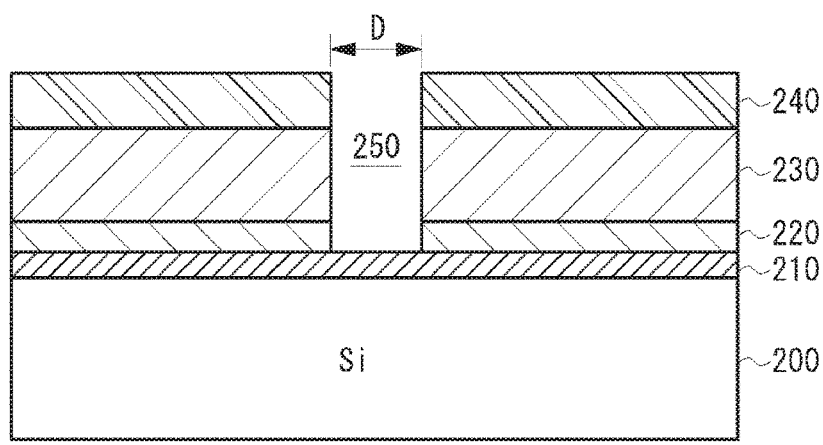

Then, as shown in FIG. 4(C), a mask layer 240 is formed on the second buffer layer 230. The mask layer 240 is, for example, a photoresist layer, and in the mask layer 240, a round-shaped opening with a diameter of D is formed through a photolithography step. Then, the mask layer 240 is used as an etching mask to perform an anisotropic dry etching to the second buffer layer 230 and the first buffer layer 220. Preferably, an etchant with a larger selection ratio between the first buffer layer 220 and the high dopant layer 210 is selected. In this way, the etching process is easily stopped at a time point of reaching the high dopant layer 210. As a result, an opening 250 with the diagram D that reaches the high dopant layer 210 is substantially formed in the second buffer layer 230 and the first buffer layer 220.

Figure 4D:
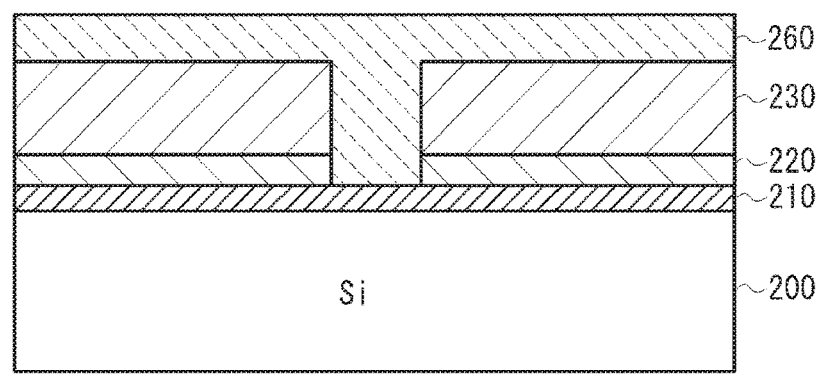

Then, the mask layer 240 is removed, as shown in FIG. 4(D), in the whole surface of the second buffer layer 230 containing the opening 250, a polysilicon layer 260 with a fixed film thickness is formed through the CVD. The polysilicon layer 260 fills the opening 250, and the polysilicon filled in the opening 250 becomes the columnar portion providing the active region or the channel region of the memory cell. In case that the memory cell has an n-type MOS structure, the polysilicon layer 260 may be p-type polysilicon doped with boron, etc. Moreover, a substance other than the polysilicon may also be used for constructing the columnar portion. In this case, the silicon layer (the high dopant layer 210) exposed by the opening 250 may be taken as a start point for epitaxial growth of the silicon layer. The silicon layer fills the opening 250 and grows to achieve a film thickness covering the whole surface of the second buffer layer 230.

Figure 5A:
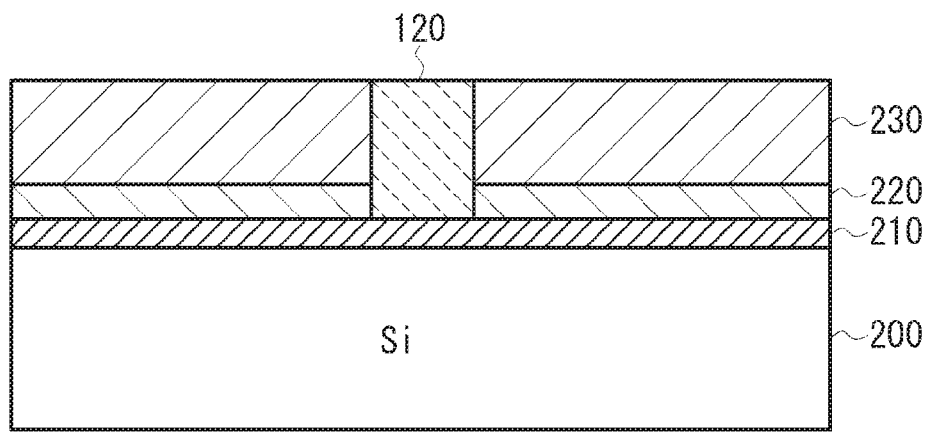
FIG. 5(A) to FIG. 5(C) are schematic cross-sectional views of manufacturing steps of the NOR flash memory according to the first embodiment of the invention.

Then, a planarization processing or an etch back processing is performed to the polysilicon layer 260. The planarization processing is preferably implemented through chemical mechanical polishing (CMP), as shown in FIG. 5(A), until the second buffer layer 230 is exposed. In this way, the columnar portion 120 containing polysilicon is formed in the opening 250. A length of the columnar portion 120 along an axial direction specifies the active region or the channel length of the memory cell. Therefore, the planarization processing is ideally performed through the CMP in a high precision. Then, phosphorus or arsenic ions are implanted to the whole surface of the second buffer layer 230 containing the columnar portion 120. Through the ion implantation, an end portion of the columnar portion 120 forms an n-type drain region. By properly selecting the ion implantation energy and time, etc., a desired drain region depth and dopant concentration may be obtained. Moreover, besides the ion implantation, an $n^+$ layer may be formed on the whole surface, and through solid-phase diffusion, the drain region is formed on the columnar portion 120.

Figure 5B:
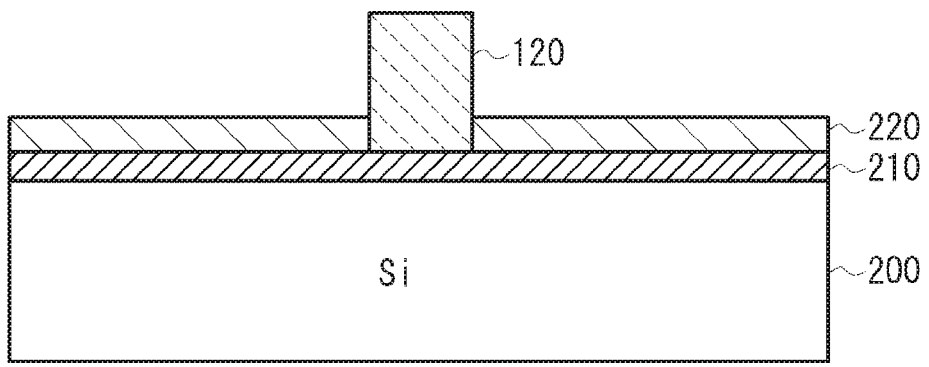

Then, as shown in FIG. 5(B), the second buffer layer 230 is removed. A wet etching process selective to the first buffer layer 220 is performed to remove the second buffer layer 230. In this way, only a bottom portion of the columnar portion 120 is surrounded by the first buffer layer 220, and a side portion and a top portion of the columnar portion 120 are exposed. It should be noted that by properly selecting the thickness of the first buffer layer 220 or the thickness of the second buffer layer 230, the length of the columnar portion 120 and a range of the exposed side portion may be determined.

Figure 5C:
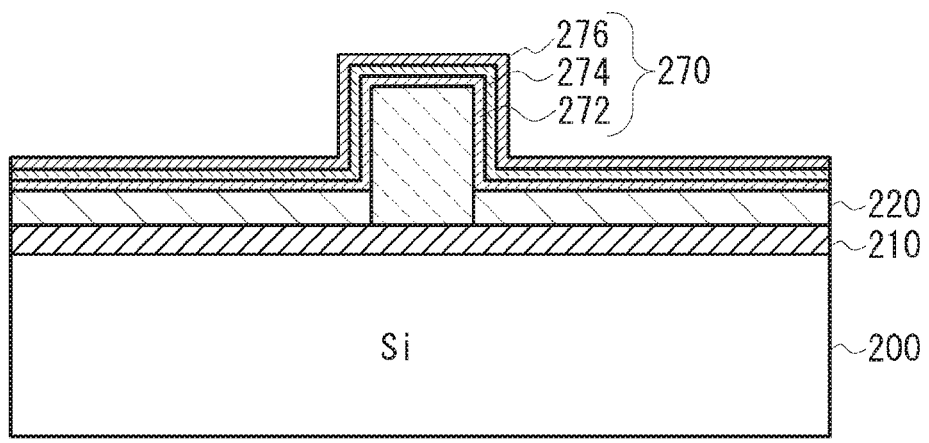

Then, as shown in FIG. 5(C), a charge accumulating portion 270 is formed on the whole surface of the first buffer layer 220 containing the columnar portion 120. The charge accumulating portion 270 has an ONO structure of an oxide film (O) 272, a nitride film (N) 274 and an oxide film (O) 276, and each film is formed in a fixed film thickness.

Figure 6A:
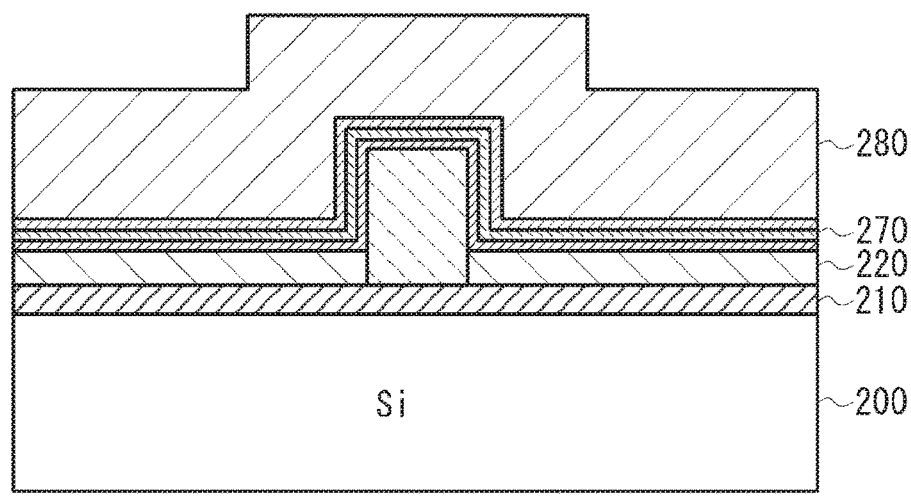
FIG. 6(A) to FIG. 6(C) are schematic cross-sectional views of manufacturing steps of the NOR flash memory according to the first embodiment of the invention.

Then, referring to FIG. 6(A), a conductive layer 280 for a control gate is formed on the whole surface in a fixed film thickness in a mode of covering the charge accumulating portion 270. The conductive layer 280 may be a metal material such as polysilicon doped with a dopant, Al, Cu, etc. Moreover, the conductive layer 280 may also include polysilicon and one or a plurality of metal layers (for example, TiN, W) formed on the polysilicon.

Figure 6B:
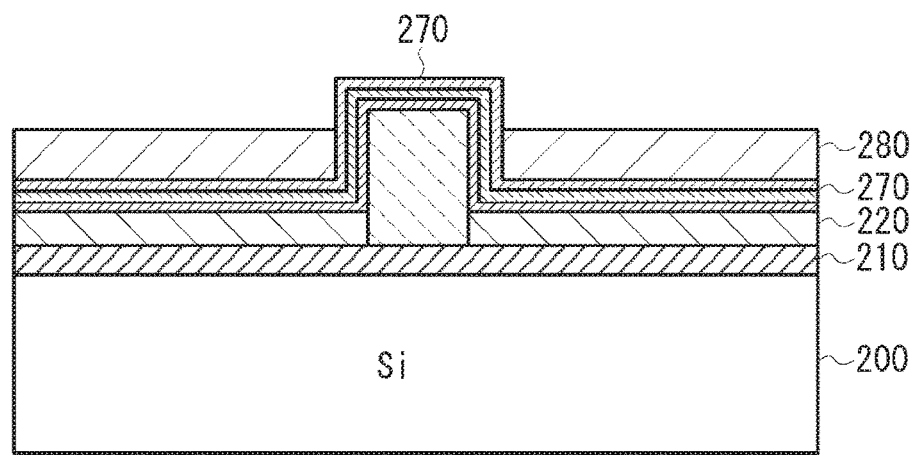

Then, as shown in FIG. 6(B), the conductive layer 280 is etched in a manner of exposing the charge accumulating portion 270. The etching process is not particularly specified, for example, the etching process may be implemented through two steps. First, the conductive layer 280 is planarized to a fixed film thickness through the CMP, and then an etchant selective to the charge accumulating portion 270 is used to etch the conductive layer 280. In this way, the charge accumulating portion 270 at the top portion of the columnar portion 120 is exposed to obtain the belt-like conductive layer 280 covering the side portion of the columnar portion 120.

Figure 6C:
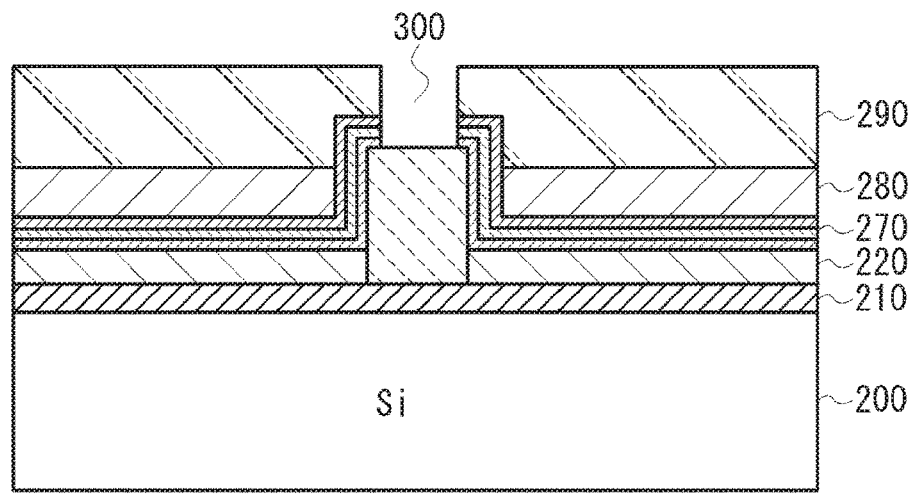

Then, an inter-layer insulation film 290 such as a silicon oxide film is, for example, formed on the whole surface of the substrate. Then, a mask layer (which is omitted in the figure) such as an anti-etching layer, etc., is formed on the inter-layer insulation film 290, and an opening is formed in the mask layer through a photolithography step. Then, as shown in FIG. 6(C), the inter-layer insulation film 290 and the charge accumulating portion 270 are etched by using the mask layer to form a contact hole 300 reaching the columnar portion 120 in the inter-layer insulation film 290.

Figure 7:
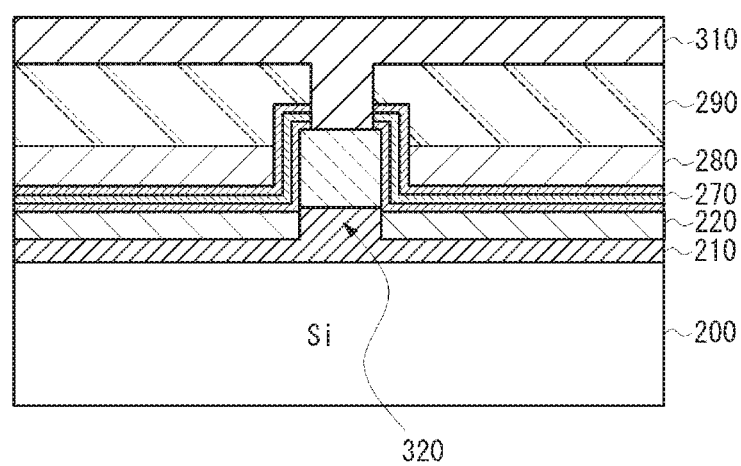
FIG. 7 is a schematic cross-sectional view of a manufacturing step of the NOR flash memory according to the first embodiment of the invention.

Then, as shown in FIG. 7, a metal material 310 used for constructing the bit line is formed on the whole surfaced of the substrate containing the contact hole 300. The metal material 310 is, for example, Al or Cu. Then, the metal material 310 is processed into the bit line through the photolithography step. Moreover, in the steps of FIG. 4(D) to FIG. 6(C), a fixed temperature is applied to the substrata, and in the above steps, the dopant of the high dopant layer 210 is diffused to the end portion of the columnar portion 120 to form an n-type source diffusion region 320 at the end portion of the columnar portion 120. The film thickness of the first buffer layer 220 is adjusted in a manner of equivalent to the dopant diffusion distance counted from the high dopant layer 210.

By forming the high dopant layer 210 (i.e. the source line SL) on the whole surface of the silicon substrate 200, the source diffusion regions 320 of all of the memory cells of the memory cell array may be commonly connected to the source line SL. Alternatively, by forming a plurality of high dopant layers 210 in selected regions of the surface of the silicon substrate 200, the source diffusion regions 320 of the selected memory cells may be commonly connected to the source line SL.

Figure 8A:
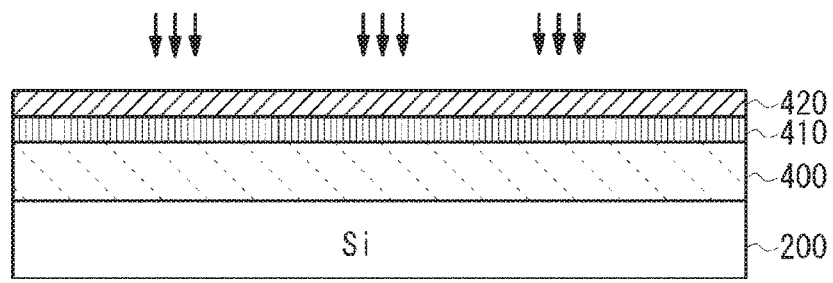
FIG. 8(A) to FIG. 8(D) are schematic cross-sectional views of manufacturing steps of the NOR flash memory according to a second embodiment of the invention.
Figure 8B:
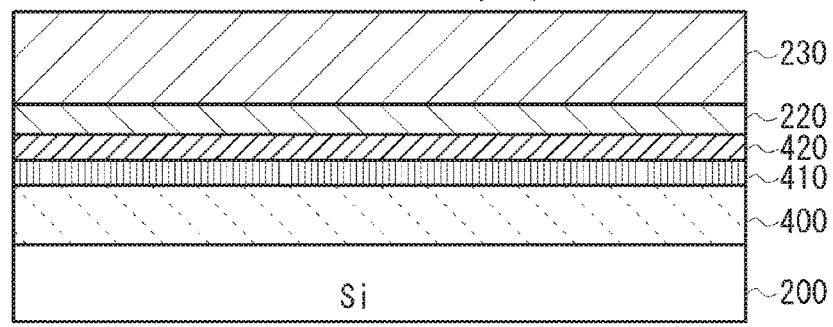
Figure 8C:
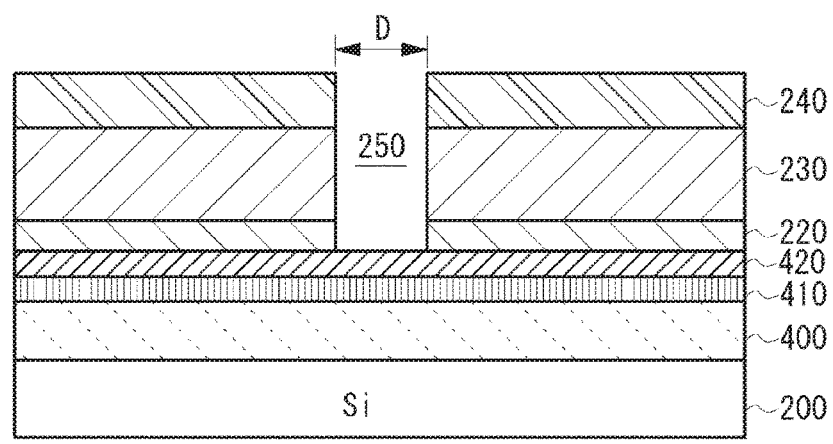
Figure 8D:
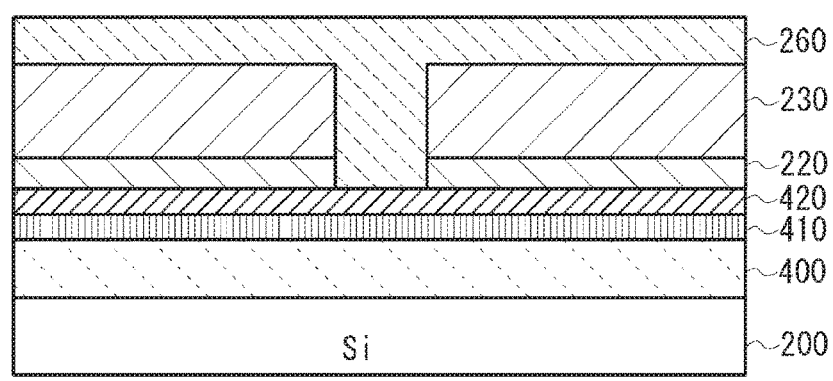
Figure 9A:
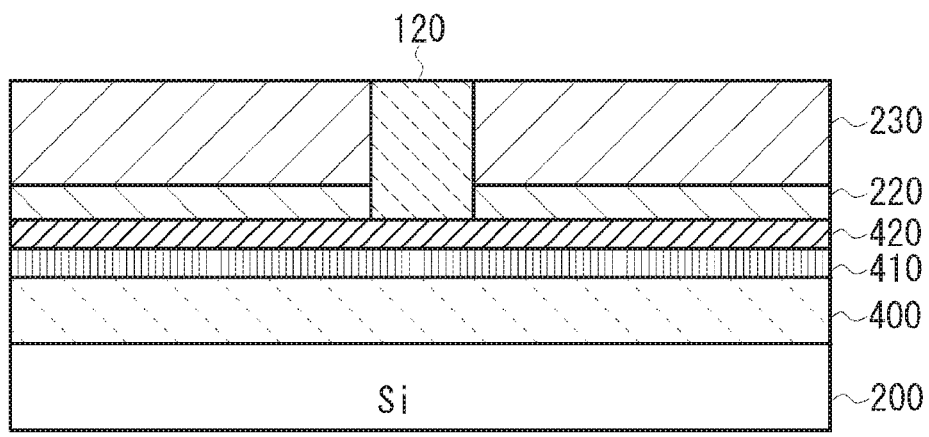
FIG. 9(A) to FIG. 9(C) are schematic cross-sectional views of manufacturing steps of the NOR flash memory according to the second embodiment of the invention.
Figure 9B:
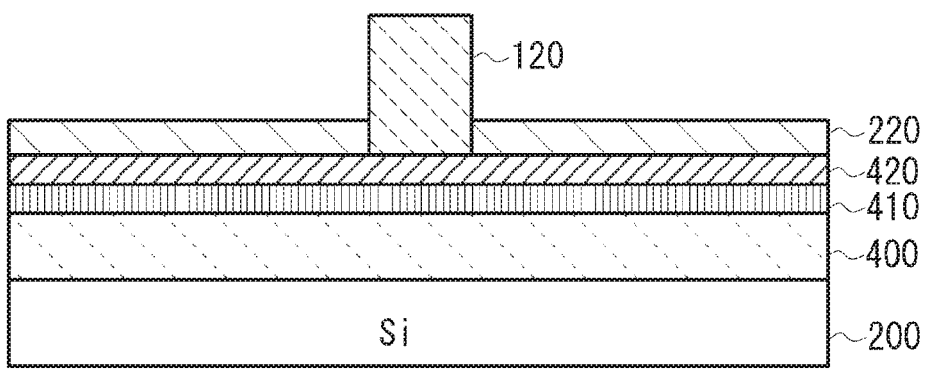
Figure 9C:
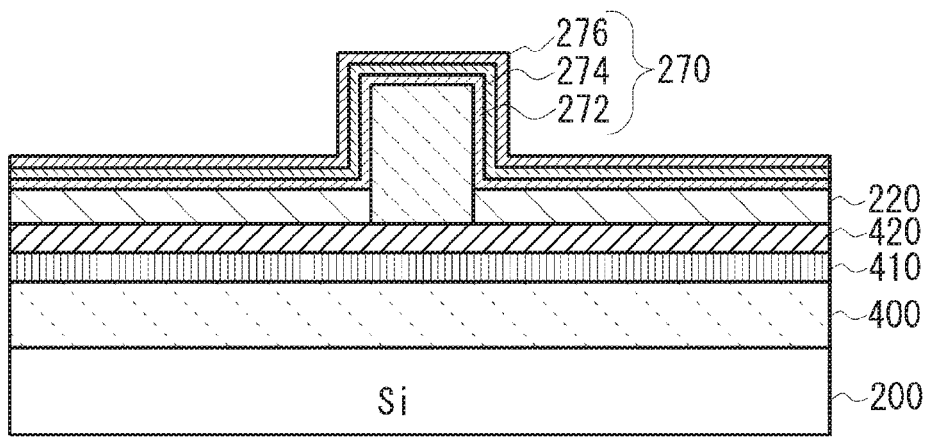
Figure 10A:
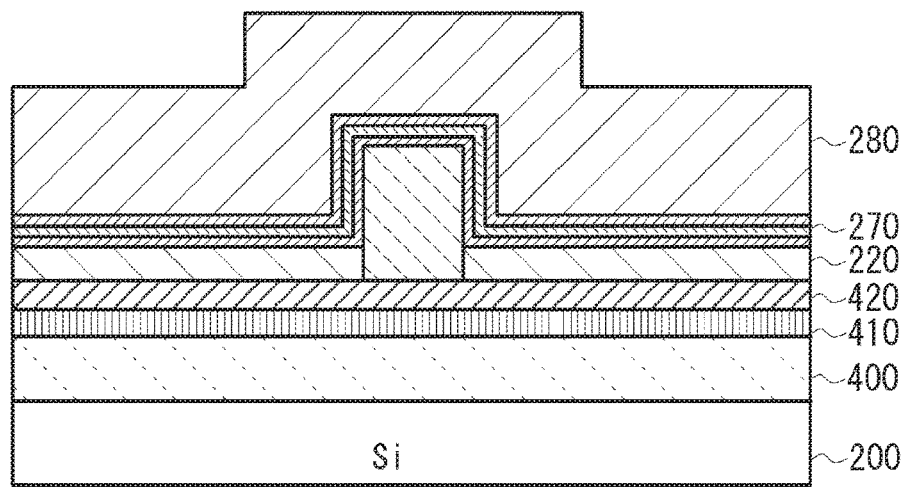
FIG. 10(A) to FIG. 10(C) are schematic cross-sectional views of manufacturing steps of the NOR flash memory according to the second embodiment of the invention.
Figure 10B:
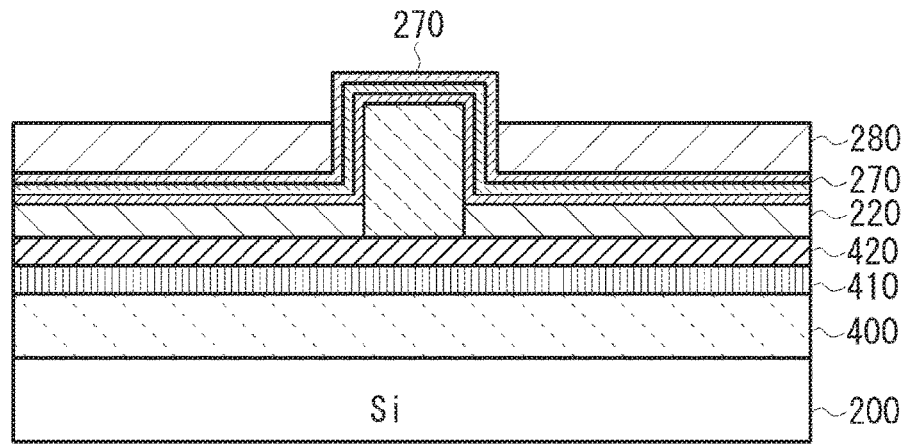
Figure 10C:
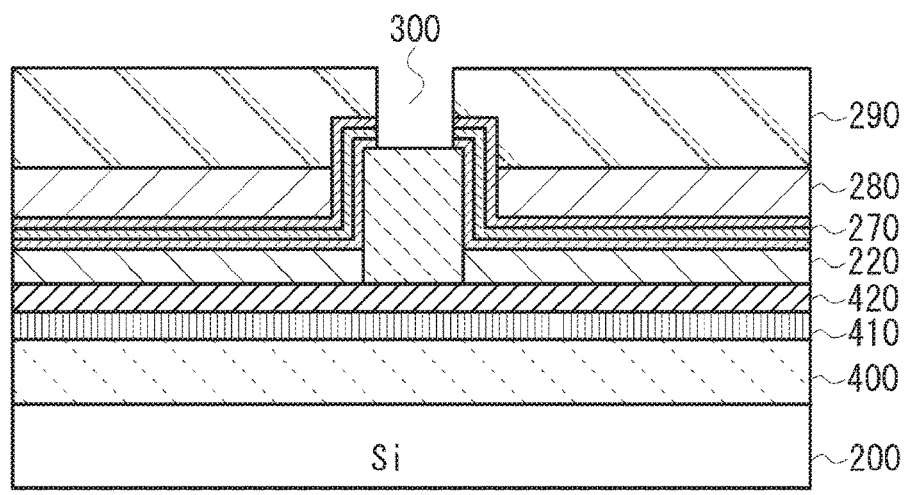

Then, referring to FIG. 8(A) to FIG. 11 for a manufacturing method of memory cells according to a second embodiment of the invention. In the second embodiment, as shown in FIG. 8(A), an insulation layer 400 is formed on the silicon substrate 200. The insulation layer 400 is, for example, a silicon oxide film. Then, a metal layer 410 is formed on the insulation layer 400. In order to tolerate a high temperature procedure in the following steps, the metal layer 410 is preferably a high melting point material, for example, a silicide metal such as WSi, etc. Then, an $n^+$ high dopant polysilicon layer 420 doped with a dopant such as phosphorus or arsenic, etc. is formed on the metal layer 410. The subsequent steps FIG. 8(B) to FIG. 11 are similar to the steps of FIG. 4(B) to FIG. 7 of the first embodiment.

Figure 11:
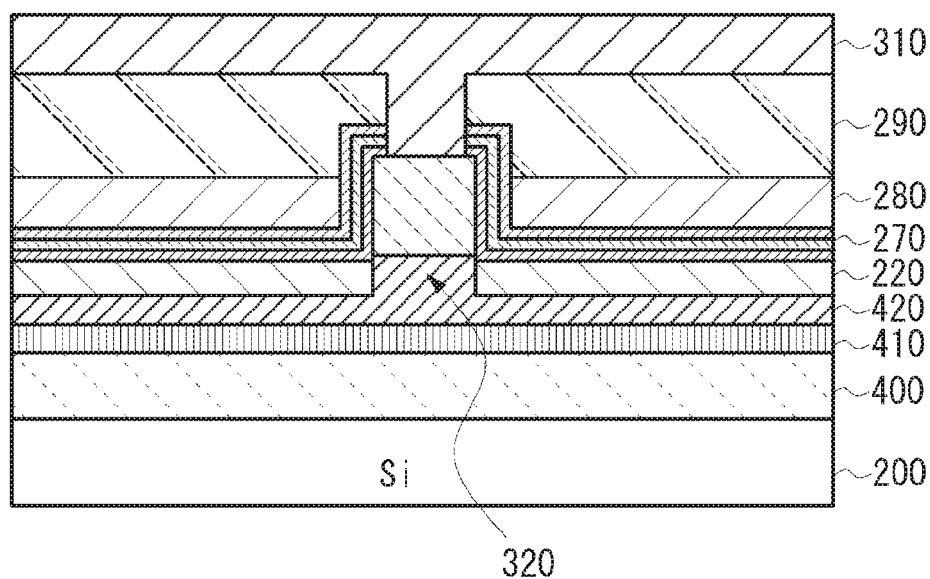
FIG. 11 is a schematic cross-sectional view of a manufacturing step of the NOR flash memory according to the second embodiment of the invention.

As shown in FIG. 11, the dopant is diffused from the $n^+$ polysilicon layer 420 to form the source diffusion region 320 at the columnar portion 120. The metal layer 410 and the $n^+$ polysilicon layer 420 construct the source line SL, and are commonly connected to all of the memory cells of the memory cell array or the source diffusion regions 320 of the selected memory cells. Moreover, a peripheral circuit may be formed on the silicon substrate 200 lower than the memory cell array, i.e. in the region where the peripheral circuit is formed, the insulation layer 400, the metal layer 410 and the polysilicon layer 420 are removed to form the peripheral circuit on the surface of the silicon substrate 200.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A NOR flash memory, comprising:
a substrate;
a high dopant layer, formed on a surface of the substrate;
a buffer layer, formed on the high dopant layer;
a plurality of columnar portions, extending from a surface of the high dopant layer in a vertical direction and comprising an active region, wherein a bottom portion of each of the columnar portions is surrounded by the buffer layer;

a plurality of charge accumulating portions, formed on the buffer layer and formed by way of surrounding a side portion of each of the columnar portions, wherein the plurality of charge accumulating portions cover a portion of the top surface of each of the columnar portions;

a plurality of control gates, formed by way of surrounding a side portion of each of the charge accumulating portions;

an inter-layer insulation film, formed on the plurality of control gates and the substrate comprising the plurality of columnar portions, wherein the inter-layer insulation film has a contact hole formed therein; and a bit line, formed in the contact hole, wherein one end portion of the columnar portion is electrically connected to the bit line via the contact hole, and another end portion of the columnar portion comprises a diffusion region formed by dopant of the high dopant layer being diffused to the another end portion through the buffer layer, wherein the buffer layer surrounds the diffusion region.

2. The NOR flash memory as claimed in claim 1, wherein the columnar portion comprises silicon or polysilicon, a drain region is formed at one end portion of the columnar portion, and a source region is formed at another end portion of the columnar portion, the columnar portion has a cylindrical shape, and the charge accumulating portion surrounds a side portion of the cylindrical shape by a circle.

3. The NOR flash memory as claimed in claim 1, wherein the charge accumulating portion comprises an oxide film-a nitride film-an oxide film (ONO).

4. The NOR flash memory as claimed in claim 1, wherein the high dopant layer is an $n^+$ silicon layer formed on a silicon substrate.

5. The NOR flash memory as claimed in claim 1, wherein a metal layer and an insulation layer are formed between the high dopant layer and the substrate, the metal layer is a high melting point silicide layer, and the high dopant layer constructs a source line, and is commonly connected to the columnar portions, wherein a film thickness of the buffer layer is equal to a dopant diffusion distance counted from the high dopant layer.

* * * * *